United States Patent
Kao et al.

(10) Patent No.: US 9,640,779 B2
(45) Date of Patent: May 2, 2017

(54) ORGANIC LIGHT EMITTING DIODE DISPLAY DEVICE

(71) Applicant: InnoLux Corporation, Miao-Li County (TW)

(72) Inventors: Chi-Lun Kao, Miao-Li County (TW); Ming-Chien Sun, Miao-Li County (TW); Kuei-Ling Liu, Miao-Li County (TW)

(73) Assignee: INNOLUX CORPORATION, Taiwan (TW)

( * ) Notice: Subject to any disclaimer, the term of this patent is extended or adjusted under 35 U.S.C. 154(b) by 0 days.

(21) Appl. No.: 15/229,261

(22) Filed: Aug. 5, 2016

(65) Prior Publication Data

US 2016/0343983 A1 Nov. 24, 2016

Related U.S. Application Data

(63) Continuation of application No. 14/579,241, filed on Dec. 22, 2014, now Pat. No. 9,437,838.

(30) Foreign Application Priority Data

Jan. 21, 2014 (TW) .............................. 103102127 A

(51) Int. Cl.
*H01L 27/15* (2006.01)
*H01L 23/22* (2006.01)
(Continued)

(52) U.S. Cl.
CPC ...... *H01L 51/5246* (2013.01); *H01L 27/3223* (2013.01); *H01L 27/3276* (2013.01); *H01L 51/5237* (2013.01)

(58) Field of Classification Search
CPC ............. H01L 2227/32; H01L 2251/50; H01L 2251/53; H01L 2251/56; H01L 33/0079;
(Continued)

(56) References Cited

U.S. PATENT DOCUMENTS 8,629,615 B2   1/2014 Kim
2007/0090759 A1 4/2007 Choi et al.
(Continued)

FOREIGN PATENT DOCUMENTS

KR           200718269 B    5/2007

*Primary Examiner* — Hsien Ming Lee
(74) *Attorney, Agent, or Firm* — Bacon & Thomas, PLLC

(57) ABSTRACT

An organic light emitting diode display device is provided, which comprises: a first substrate having a first surface with a first side; and a glass-forming sealant disposed thereon, adjacent to the first side and having a top surface, a bottom surface opposite to the top surface, and a middle surface therebetween. The middle surface has a first end connecting to the top surface, a second end connecting to the bottom surface and a third end therebetween. A first distance between a first projection of the first end on the first surface and the first side is unequal to a second distance between a second projection of the second end on the first surface and the first side; and a third distance between a third projection of the third end on the first surface and the first side is shorter than the first or second distance.

16 Claims, 6 Drawing Sheets

(51) Int. Cl.
*H01L 21/00* (2006.01)
*H01L 51/52* (2006.01)
*H01L 27/32* (2006.01)

(58) Field of Classification Search
CPC .................. H01L 33/54; H01L 33/56; H01L 2924/01079; H01L 2924/01078; H01L 27/156; H01L 27/1214
USPC .......... 257/79–81, 433, 687; 438/26–29, 51, 438/106, 107
See application file for complete search history.

(56) References Cited

U.S. PATENT DOCUMENTS

| | | |
|---|---|---|
| 2009/0206738 A1 | 8/2009 | Koo et al. |
| 2012/0241802 A1* | 9/2012 | Philippens .......... H01L 51/5237 257/99 |
| 2013/0134396 A1 | 5/2013 | Shimomura et al. |
| 2015/0207099 A1 | 7/2015 | Kao et al. |

* cited by examiner

ORGANIC LIGHT EMITTING DIODE DISPLAY DEVICE

CROSS REFERENCE TO RELATED APPLICATION

This application claims the benefits of the Taiwan Patent Application Serial Number 103102127, filed on Jan. 21, 2014, the subject matter of which is incorporated herein by reference.

This application is a continuation (CA) of U.S. patent application for "ORGANIC LIGHT EMITTING DIODE DISPLAY DEVICE", U.S. application Ser. No. 14/579,241 filed Dec. 22, 2014, and the subject matter of which is incorporated herein by reference.

BACKGROUND OF THE INVENTION

1. Field of the Invention

The present invention relates to an organic light emitting diode (OLED) display device and, more particularly, to an OLED display device comprising a glass-forming sealant with a specific structure.

2. Description of Related Art

OLED display devices are light in weight and ultra-thin in thickness, and also have advantages of high brightness, rapid response, wide viewing angles, no backlight requirement, low manufacturing cost and flexibility. Hence, OLED display devices have great potential to apply on display panels of various electronic devices such as panels of smartphones, pads, notebooks, monitors and televisions. However, for the OLED display panel, one important factor causing the lifetime thereof reduced is the pollution and erosion by moisture. Hence, a binder having excellent moisture barrier property and air impermeability has to be used to seal the panel, in order to produce a display device having good moisture barrier property and air impermeability.

In general, during the process for manufacturing the OLED display device, a thin film transistor unit and an OLED unit are firstly formed on a bottom substrate, and then the obtained bottom substrate is assembled to the upper substrate with spacers formed thereon to obtain the OLED display device. In the case that both the bottom substrate and the upper substrate are glass substrate, a glass-forming sealant can be used to package the bottom substrate and the upper substrate to form the OLED display device because it has good moisture barrier property and air impermeability.

However, if the structure of the glass-forming sealant after assembling process is not designed well, the adhesion between the glass-forming sealant and the bottom and upper substrates are not good enough, resulting in the problem that the glass-forming sealant peels off from the substrate or cracks present in the glass-forming sealant bringing the moisture permeation; and these problems cause the production rate of the OLED display devices reduced. Hence, the glass-forming sealant has to be designed to have specific structure to increase the adhesion between the sealant and the substrate.

SUMMARY OF THE INVENTION

An object of the present invention is to provide an OLED display device, in which the glass-forming sealant comprised therein has a specific structure to increase the adhesion between the glass-forming sealant and the upper/bottom substrates, and therefore the moisture barrier property and the air impermeability thereof can further be improved.

To achieve the object, an aspect of the present invention is to provide an OLED display device, comprising: a first substrate; a second substrate opposite to the first substrate; an organic light emitting layer disposed between the first substrate and the second substrate; and a glass-forming sealant disposed between the first substrate and the second substrate and around the organic light emitting layer. Herein, the glass-forming sealant comprises: a first portion adjacent to the first substrate, in which a first angle is included between the first portion and the first substrate, which is smaller than 90°; and a second portion adjacent to the second substrate, in which a second angle is included between the second portion and the second substrate, which is smaller than 90°, and the first angle is different from the second angle.

More specifically, in the OLED display device of this aspect of the present invention, the first substrate has a first surface, the second substrate has a second surface, the first angle is included between a first tangent line to the first portion adjacent to the first surface, the second angle is included between a second tangent line to the second portion adjacent to the second surface, both the first angle and the second angle are smaller than 90°, and the first angle is different from the second angle. In the present invention, the term "first/second tangent line" used in the present invention refers to a tangent line to an optimized curve of the periphery of the first/second portion of the glass-forming sealant.

In addition, another aspect of the present invention is to provide an OLED display device, comprising: a first substrate; a second substrate opposite to the first substrate; an organic light emitting layer disposed between the first substrate and the second substrate; and a glass-forming sealant disposed between the first substrate and the second substrate and around the organic light emitting layer. Herein, the glass-forming sealant comprises: a first portion adjacent to the first substrate; a second portion adjacent to the second substrate; and a third portion locating between the first portion and the second portion, and comprising a region that the glass-forming sealant has a maximum width of a section thereof.

More specifically, in the OLED display device of this aspect of the present invention, the first portion, the second portion and the third portion respectively has a first width, a second width and a third width of a section thereof, and the third width is larger than the first width and the second width.

Furthermore, another aspect of the present invention is to provide an OLED display device, comprising: a first substrate; a second substrate opposite to the first substrate and has a first side; an organic light emitting layer disposed between the first substrate and the second substrate; and a glass-forming sealant disposed between the first substrate and the second substrate and being adjacent to the first side. Herein, the glass-forming sealant has: a first end connecting to the first substrate and being apart from the first side in a first distance; a second end connecting to the second substrate and being apart from the first side in a second distance; and a third end locating between the first end and the second end and being apart from the first side in a third distance, wherein the first distance is unequal to the second distance, and the third distance is shorter than the first distance or the second distance.

In the OLED display device of this aspect of the present invention, the third distance may be shorter than the first distance or the second distance. Alternatively, the glass-forming sealant comprises a first extension part adjacent to the first substrate, and a protrusion part adjacent to the first extension part, wherein the first extension part has the first end, the protrusion part has the second end, the third end and a fourth end, the third end locates between the second end and the fourth end, the fourth end connects to the first extension part and is a part from the first side in a fourth distance, the first distance is shorter than the third distance, and the third distance is shorter than the second distance and the fourth distance. Otherwise, the glass-forming sealant comprises a second extension part adjacent to the second substrate, and a protrusion part adjacent to the second extension part, wherein the second extension part has the second end, the protrusion part has the first end, the third end and a fifth end, the third end locates between the first end and the fifth end, the fifth end connects to the second extension part and is apart from the first side in a fifth distance, the second distance is shorter than the third distance, and the third distance is shorter than the first distance and the fifth distance.

Moreover, another aspect of the present invention is to provide an OLED display device, comprising: a first substrate; a second substrate opposite to the first substrate and has a first side; an organic light emitting layer disposed between the first substrate and the second substrate; and a glass-forming sealant disposed between the first substrate and the second substrate and being adjacent to the first side. Herein, the glass-forming sealant comprises: a first extension part adjacent to the first substrate, a second extension part adjacent to the second substrate, and a protrusion part locating between the first extension part and the second extension part. Herein, the first extension part has a first end, which connects to the first substrate and is apart from the first side in a first distance; the second extension part has a second end, which connects to the second substrate and is apart from the first side in a second distance; and the protrusion part has a third end, a fourth end and a fifth end, in which the third end locates between the fourth end and the fifth end and is part from the first side in a third distance, the fourth end connects to the first extension part and is apart from the first side in a fourth distance, the fifth end connects to the second extension part and is apart from the first side in a fifth distance. Additionally, the first distance and the second distance are respectively smaller than the third distance, and the third distance is smaller than both the fourth distance and the fifth distance.

In addition, another aspect of the present invention is to provide an OLED display device, comprising: a first substrate; a second substrate opposite to the first substrate; an organic light emitting layer disposed between the first substrate and the second substrate; and a glass-forming sealant disposed between the first substrate and the second substrate and around the organic light emitting layer. Herein, the second substrate comprises a metal line region and a non-metal line region, and a width of a section of the glass-forming sealant corresponding to the metal line region is larger than that corresponding to the non-metal line region.

In the OLED display device of this aspect of the present invention, the first portion, the metal line region may comprise: plural metal traces, a metal layer with plural holes, or a combination thereof. In addition, the non-metal line region may comprise: a dummy pattern.

It should be noted that at least two aspects of the aforementioned aspects of the present invention may be comprised in one OLED display device of the present invention at the same time.

Furthermore, the term "section" used in the present invention refers to the section perpendicular to a longitudinal direction of the glass-forming sealant.

Other objects, advantages, and novel features of the invention will become more apparent from the following detailed description when taken in conjunction with the accompanying drawings.

DETAILED DESCRIPTION OF THE PREFERRED EMBODIMENT

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

Figure 1:
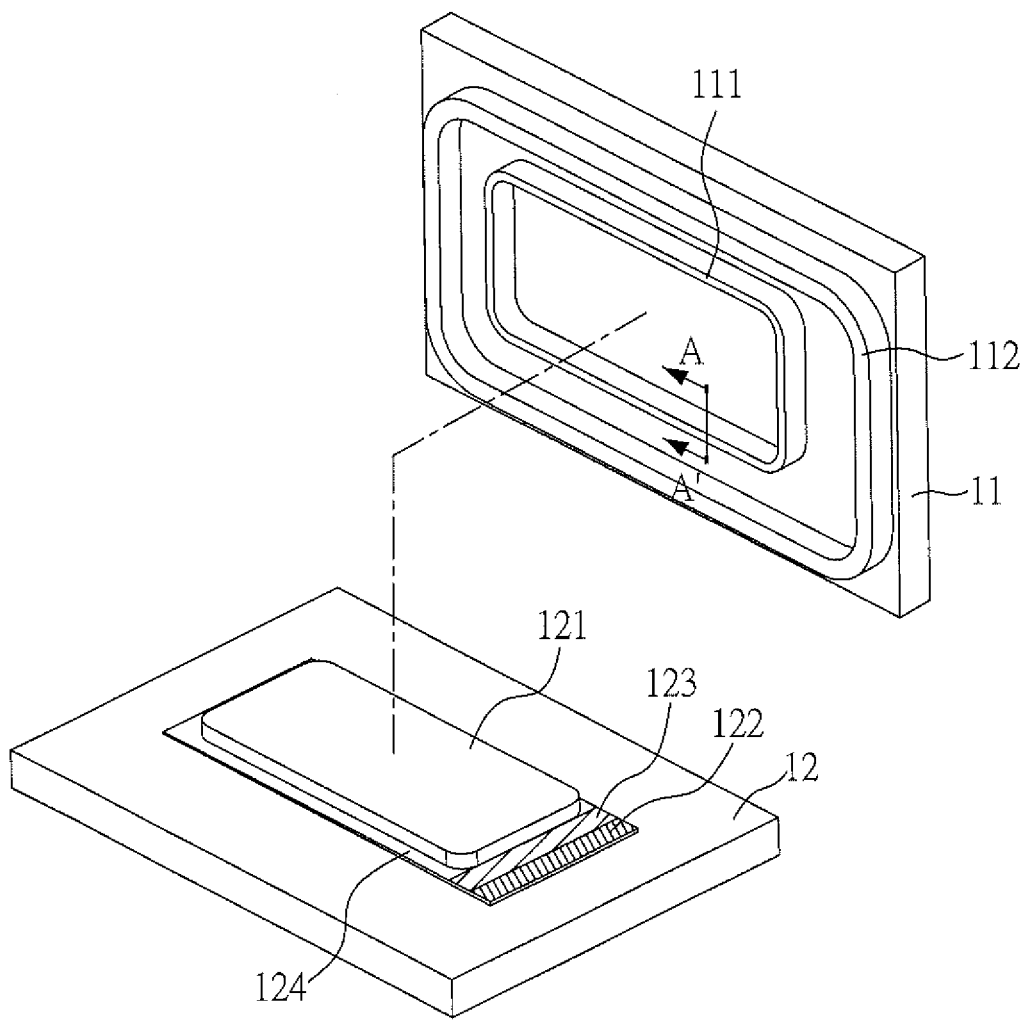
FIG. 1 is a perspective view showing a first mother substrate and a second mother substrate before assembling to each other according to one preferred embodiment of the present invention.

Please refer to FIG. 1, which is a perspective view showing a first mother substrate and a second mother substrate before assembling to each other according to one preferred embodiment of the present invention. First, a first mother substrate 11 and a second mother substrate 12 are provided, wherein both of them are glass substrates. Herein, the first mother substrate is firstly coated with a glass-forming sealant ill, and then the glass-forming sealant 111 is heated to be cured to fix on the first mother substrate 11. In the present embodiment, the glass-forming sealant 111 having a width of about 350 μm to 2000 μm is formed on the first mother substrate 11 through screening printing or glue dispensing processes. Next, the first mother substrate 11 with the glass-forming sealant 111 formed thereon is heated to 80° C.~200° C. to remove the solvent in the glass-forming sealant 111, and then to 350° C.~550° C. to carbonize the organic component therein. However, in other embodiments, the aforementioned temperature ranges and the width of the glass-forming sealant 111 can be adjusted according to the types thereof, as long as the glass-forming sealant 111 can be fixed on the first mother substrate 11.

Figure 2:
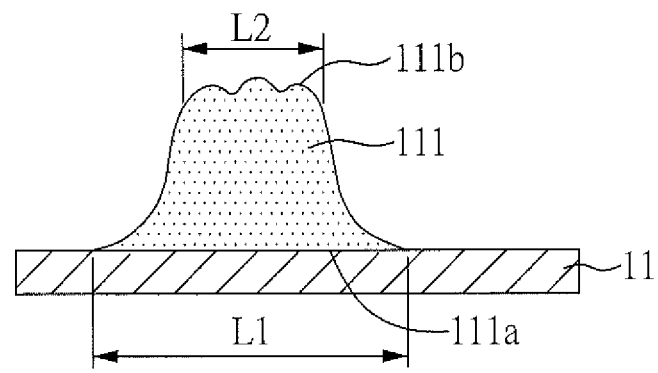
FIG. 2 is a cross-sectional view of a glass-forming sealant before a first mother substrate and a second mother substrate are assembled to each other according to one preferred embodiment of the present invention.

Please refer to FIG. 2, which is a cross-sectional view of a glass-forming sealant along a cross-sectional line A-A' shown in FIG. 1 according to one preferred embodiment of the present invention. As shown in FIG. 2, the glass-forming sealant 111 has a first side 111a contacting the first mother substrate 11 and a second side 111b opposite to the first side 111a, in which the second side 111b has a rough surface. In addition, a width L1 of the first side 111a is larger than a width L2 of the second side 111b; and the width L1 of the first side 111a is preferably at least 25 μm larger than the width L2 of the second side 111b (L1−L2≥25 μm). In the present embodiment, the width L2 is about 600 μm, and the width L1 is about 650 μm. However, in other embodiments, the width L1 and the width L2 are not limited thereto.

In addition, in the present embodiment, the glass-forming sealant 111 can be any sealant generally used in the art, such as a frit sealant made of a mixture containing glass powders and binders. However, the glass powders can be substituted with other materials such as ceramic powders, as long as the sealant can adhere well with the glass substrate after sintering and be capable of providing good moisture barrier property and air impermeability.

Next, as shown in FIG. 1, frame glue 112 is formed along the periphery of the glass-forming sealant 111 at a predetermined distance and along edges of the first mother substrate 11. Herein, the frame glue 112 can be UV glue generally used in the art.

In the present embodiment, the glass-forming sealant 111 and the frame glue 112 can be formed on the first mother substrate 11 through any process generally used in the art, such as screening printing or glue dispensing processes.

As shown in FIG. 1, an organic light emitting layer 121 is formed on the second mother substrate 12. Herein, a terminal unit 122 and a metal line region 123 are further formed on the second mother substrate 12, and the metal line region 123 may comprise: plural metal traces, a metal layer with plural holes, or a combination thereof.

In the present embodiment, only the organic light emitting layer 121 is shown in FIG. 1. However, a person skill in the art can understand that the OLED display device of the present embodiment may further comprise other units, such as a thin film transistor unit and an OLED unit comprising two electrodes and the organic light emitting layer sandwiching therebetween; and the OLED unit may further comprise other layers capable of facilitating the efficiency of the organic light emitting layer such as a hole injection layer, a hole transporting layer, an electron injection layer and/or an electron transporting layer. Herein, the detail structures of the aforementioned units are not described.

In addition, in the present embodiment, only one organic light emitting layer 121, one glass-forming sealant 111 and one frame glue 112 are shown in FIG. 1. However, a person skilled in the art can understand that plural organic light emitting layers 121 and plural glass-forming sealants 111 (and plural frame glues 112, in some cases) may be formed in arrays on the first mother substrate 11 and the second mother substrate 12 to manufacture the OLED display devices of the present embodiment.

The frame glue 112 is cured with UV radiation, after the first mother substrate 11 and the second mother substrate 12 shown in FIG. 1 are assembled to each other and the glass-forming sealant 111 and the frame glue 112 correspond to and surround the organic light emitting layer 121. Next, the glass-forming sealant 111 is sintered with laser to fix the glass-forming sealant 111 on the second mother substrate 12. Finally, the first mother substrate 11 and the second mother substrate 12 are cut to obtain the OLED display device of the present embodiment, as shown in FIG. 3 and FIG. 4.

Figure 3:
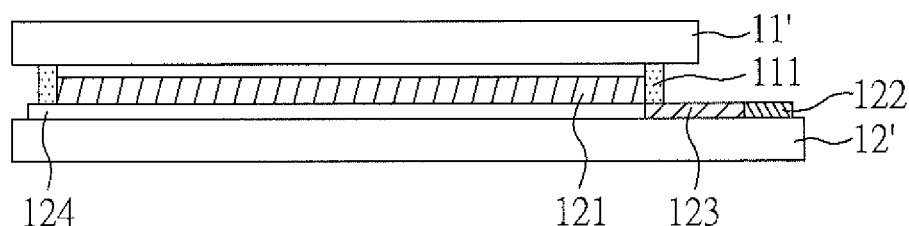
FIG. 3 is a cross-sectional view of an OLED display device according to one preferred embodiment of the present invention.
Figure 4:
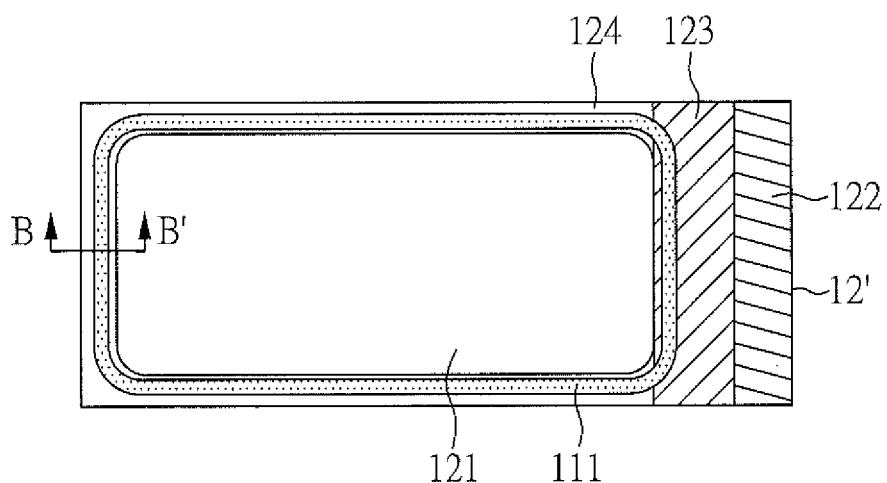
FIG. 4 is a top-view of an OLED display device according to one preferred embodiment of the present invention.

As shown in FIG. 3 and FIG. 4, the OLED display device of the present embodiment comprises: a first substrate 11'; a second substrate 12' (i.e. a thin film transistor substrate) opposite to the first substrate 11'; an organic light emitting layer 121 disposed between the first substrate 11' and the second substrate 12'; and a glass-forming sealant 111 disposed between the first substrate 11' and the second substrate 12' and around an external periphery of the organic light emitting layer 121. In addition, the OLED display device of the present embodiment may further comprise: a driving unit (not shown in the figure).

Hereinafter, a detail structure of the glass-forming sealant of the present embodiment is illustrated below.

Figure 5:
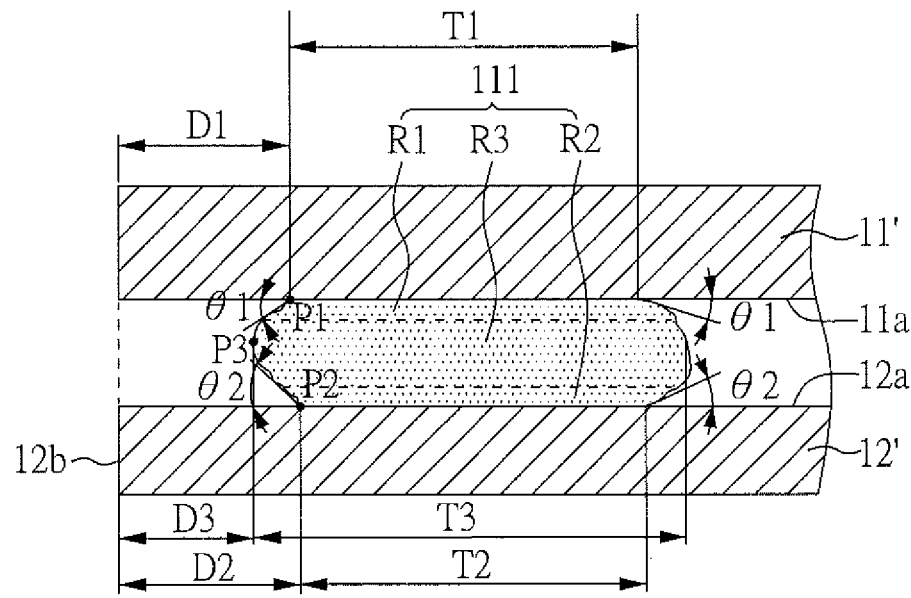
FIG. 5 is a cross-sectional view showing a glass-forming sealant of an OLED display device according to one preferred embodiment of the present invention.

Please refer to FIG. 5, which is a cross-sectional view showing a glass-forming sealant of an OLED display device along a cross-sectional line B-B' shown in FIG. 4 according to one preferred embodiment of the present invention. Herein, the glass-forming sealant 111 of the present embodiment comprises: a first portion R1 adjacent to the first substrate 11', in which a first angle θ1 is included between the first portion R1 and the first substrate 11', which is smaller than 90°; and a second portion R2 adjacent to the second substrate 12', in which a second angle θ2 is included between the second portion R2 and the second substrate 12', which is smaller than 90°, and the first angle θ1 is different from the second angle θ2.

More specifically, in the OLED display device of the present embodiment, the first substrate 11' has a first surface 11a, the second substrate 12' has a second surface 12a, the first angle θ1 is included between a first tangent line to the first portion R1 adjacent to the first surface 11a, and the second angle θ2 is included between a second tangent line to the second portion R2 adjacent to the second surface 12a. Herein, the first angle θ1 is different from the second angle θ2 and both of them are smaller than 90°. Preferably, the first angle θ1 and the second angle θ2 respectively range between 20° and 70°. In the present embodiment, the "first/second tangent line" is a tangent line to an optimized curve of the periphery of the first/second portion R1/R2 of the glass-forming sealant 111.

In the section of the glass-forming sealant of the present embodiment along the cross-sectional line B-B' shown in FIG. 4, as shown in FIG. 5, the left first angle θ1 thereof is about 37.87° and the left second angle θ2 thereof is about 42.40°. Additionally, the right first angle θ1 thereof is about 25.82° and the right second angle θ2 thereof is about 27.76°. However, the angles included between the glass-forming sealant and the substrate in the OLED display device are not limited to the aforementioned values; and the first angle θ1 and the second angle θ2 may be differed in other sections of the glass-forming sealant along other cross-sectional lines. In addition, the relation between the degrees of the first angle θ1 and the second angle θ2 are not particularly limited, and the first angle θ1 may be larger or smaller than the second angle θ2. Preferably, the first angle θ1 is smaller than the second angle θ2.

In the present embodiment, the purpose of the first angle θ1 being smaller than the second angle θ2 can be achieved and the shape of the glass-forming sealant can be adjusted by controlling the focal lengths, the angles, the application time and the energy of the applied laser beams as well as the types and the viscosity of the glass-forming sealant.

In addition, as shown in FIG. 5, in the OLED display device of the present embodiment, the glass-forming sealant 111 may comprises: a first portion R1 adjacent to the first substrate 11'; a second portion R2 adjacent to the second substrate 12'; and a third portion R3 locating between the first portion R1 and the second portion R2, and comprising a region that the glass-forming sealant 111 has a maximum width of a section thereof. In the present embodiment, the "section" is a section perpendicular to a longitudinal direction of the glass-forming sealant, as shown in FIG. 4.

More specifically, in one section of the glass-forming sealant in the OLED display device of the present embodiment, the first portion R1 of the glass-forming sealant 111 adjacent to the first substrate 11' has a first width T1, the second portion R2 thereof adjacent to the second substrate 12' has a second width T2, the third portion R3 comprising a region that the glass-forming sealant 111 has a maximum width has a third width T3, and the third width T3 (and particularly, the maximum width) is larger than both the first width T1 and the second width T2. Preferably, the first width T1 is larger than the second width T2. In the section of the glass-forming sealant of the present embodiment along the cross-sectional line B-B' shown in FIG. 4, as shown in FIG. 5, the first width T1 is about 640 μm, the second width T2 is about 610 μm, and the third width T3 is about 650 μm. However, the widths of the glass-forming sealant of the OLED display device are not limited to the aforementioned values, and may be differed in other sections of the glass-forming sealant along other cross-sectional lines.

Furthermore, as shown in FIG. 5, in the OLED display device of the present embodiment, on the basis of the first side 12b of the second substrate 12' (including not only the edge of the second substrate 12' but also an extension surface thereof extending therefrom to the edge of the first substrate 11' (indicated in the dot lines)), the glass-forming sealant 111 has: a first end P1 connecting to the first substrate 11' and being apart from the first side 12b in a first distance D1; a second end P2 connecting to the second substrate 12' and being apart from the first side 12b in a second distance D2; and a third end P3 locating between the first end P1 and the second end P2 and being apart from the first side 12b in a third distance D3, wherein the first distance D1 is unequal to the second distance D2, and the third distance D3 is shorter than the first distance D1 or the second distance D2.

More specifically, in the OLED display device of the present embodiment, the third distance D3 is shorter than both the first distance D1 and the second distance D2. Herein, the first distance D1 is about 360 μm, the second distance is about 390 μm, and the third distance is about 350 μm. However, the aforementioned distances of the glass-forming sealant of the OLED display device are not limited to the aforementioned values, and may be differed in other sections of the glass-forming sealant along other cross-sectional lines.

Figure 6:
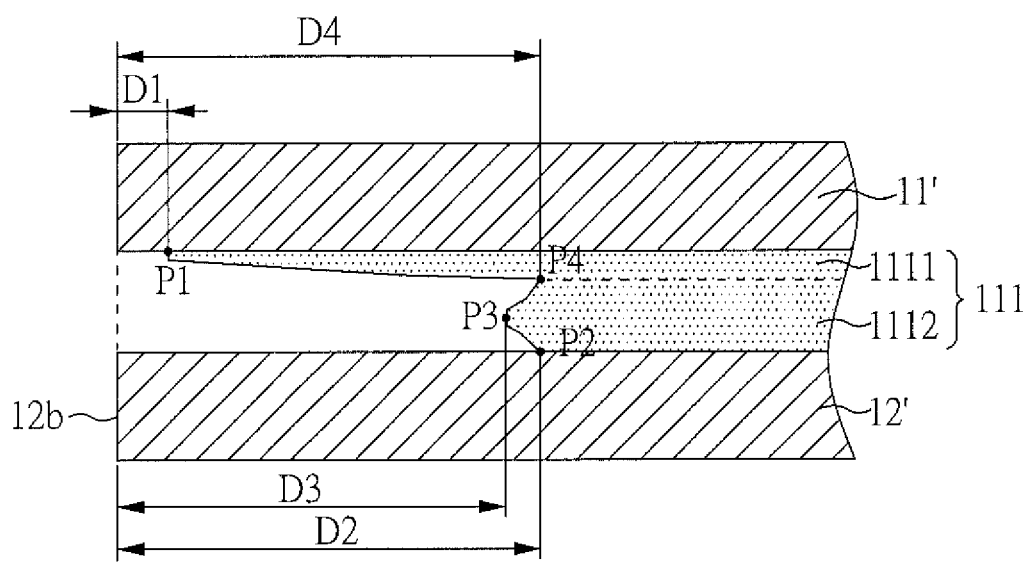
FIG. 6 is a cross-sectional view showing a glass-forming sealant of an OLED display device according to another preferred embodiment of the present invention.
Figure 7:
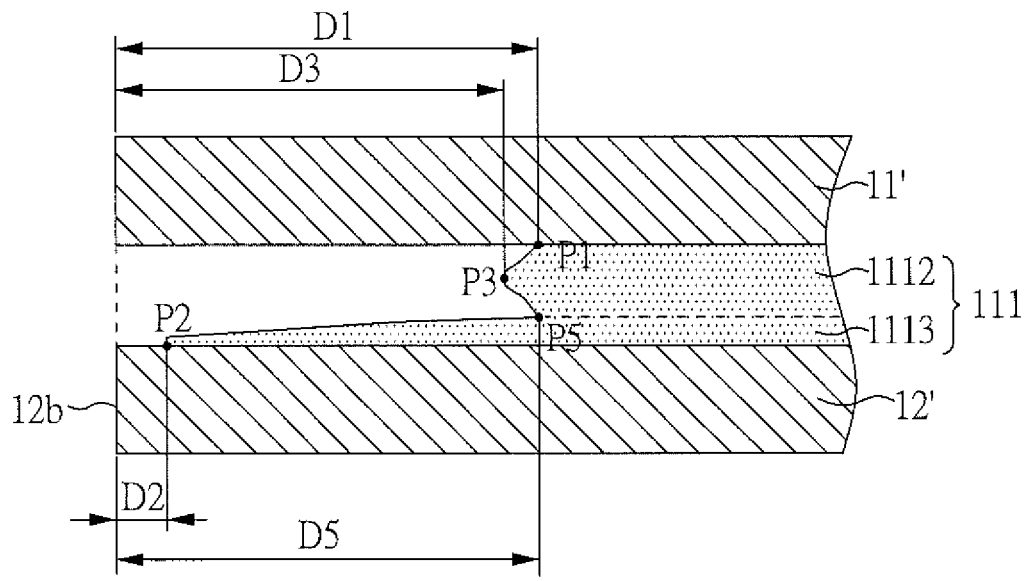
FIG. 7 is a cross-sectional view showing a glass-forming sealant of an OLED display device according to further another preferred embodiment of the present invention.
Figure 8:
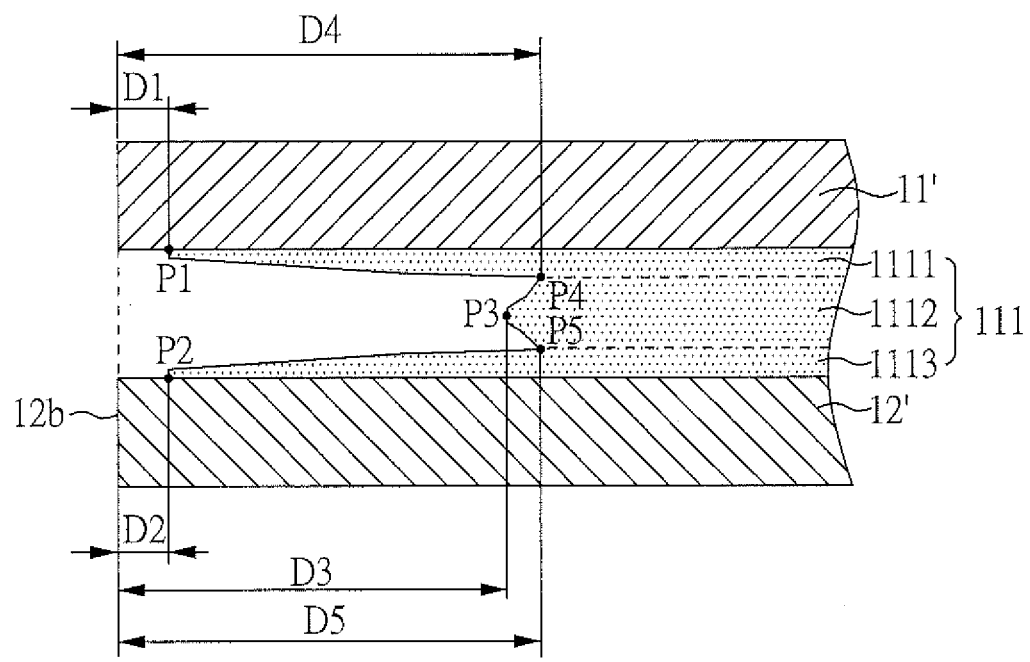
FIG. 8 is a cross-sectional view showing a glass-forming sealant of an OLED display device according to further another preferred embodiment of the present invention.

In addition, in other embodiments of the present invention, the left side of the glass-forming sealant 111 shown in FIG. 5 (i.e. the side thereof close to the first substrate 11' and/or the second substrate 12') may further comprise an extension part, as shown in FIG. 6 to FIG. 8.

In another embodiment of the present invention, as shown in FIG. 6, the glass-forming sealant 111 comprises a first extension part 1111 adjacent to the first substrate 11', and a protrusion part 1112 adjacent to the first extension part 1111. Herein, the first extension part 1111 has a first end P1, the protrusion part 1112 has a second end P2, a third end P3 and a fourth end P4, and the third end P3 locates between the second end P2 and the fourth end P4. The first end P1 connects to the first substrate 11' and is apart from the first side 12b in a first distance D1; the second end P2 connects to the second substrate 12' and is apart from the first side 12b in a second distance D2; the fourth end P4 connects to the first extension part 1111 and is apart from the first side 12b in a fourth distance D4; and the third end P3 is apart from the first side 12b in a third distance D3. The first distance D1 is shorter than the third distance D3, and the third distance D3 is shorter than both the second distance D2 and the fourth distance D4. Additionally, the second distance D2 and the fourth distance D4 can be identical or different. In this section shown in FIG. 6, the first distance D1 is about 220 μm, the second distance D2 is about 460 μm, the third distance D3 is about 390 μm, and the fourth distance D4 is about 410 μm.

Furthermore, in another embodiment of the present invention, as shown in FIG. 7, the glass-forming sealant 111 comprises a second extension part 1113 adjacent to the second substrate 12', and a protrusion part 1112 adjacent to the second extension part 1113. Herein, the second extension part 1113 has a second end P2, the protrusion part 1112 has a first end P1, a third end P3 and a fifth end P5, and the third end P3 locates between the first end P1 and the fifth end P5. The first end P1 connects to the first substrate 11' and is apart from the first side 12b in a first distance D1; the second end P2 connects to the second substrate 12' and is apart from the first side 12b in a second distance D2; the fifth end P5 connects to the second extension part 1113 and is apart from the first side 12b in a fifth distance D5; and the third end P3 is apart from the first side 12b in a third distance D3. The second distance D2 is shorter than the third distance D3, and the third distance D3 is shorter than both the first distance D1 and the fifth distance D5. Additionally, the second distance D2 and the fifth distance D5 can be identical or different. In this section shown in FIG. 7, the first distance D1 is about 320 μm, the second distance D2 is about 190 μm, the third distance D3 is about 280 μm, and the fifth distance D5 is about 340 μm.

Moreover, in another embodiment of the present invention, as shown in FIG. 8, the glass-forming sealant 111 comprises a first extension part 1111 adjacent to the first substrate 11', a second extension part 1113 adjacent to the second substrate 12', and a protrusion part 1112 locating between the first extension part 1111 and the second extension part 1113. Herein, the first extension part 1111 has a first end P1, the second extension part 1113 has a second end P2, and the protrusion part 1112 has a third end P3, a fourth end P4 and a fifth end P5. The first end P1 connects to the first substrate 11' and is apart from the first side 12b in a first distance D1; the second end P2 connects to the second substrate 12' and is apart from the first side 12b in a second distance D2; the third end P3 locates between the fourth end P4 and the fifth end P5 and is apart from the first side 12b in a third distance D3; the fourth end P4 connects to the first extension part 111 and is apart from the first side 12b in a fourth distance D4; and the fifth end P5 connects to the second extension part 1113 and is apart from the first side 12b in a fifth distance D5. Additionally, the first distance D1 and the second distance D2 are respectively shorter than the third distance D3, and the third distance D3 is shorter than both the fourth distance D4 and the fifth distance D5.

As shown in the FIG. 6 to FIG. 8, the portion of the glass-forming sealant contacting to the substrate may selectively comprise an extension part, which can increase the contact area between the glass-forming sealant and the substrate. Hence, the problem that the glass-forming sealant peeling off from the substrate can be greatly prevented, and therefore the moisture barrier property and the air impermeability thereof can further be improved. Herein, the shape of the glass-forming sealant can be adjusted to selectively comprise the extension part by controlling the focal lengths, the angles, the application time and the energy of the applied laser beams as well as the types and the viscosity of the glass-forming sealant. If a glass-forming sealant with an extension part is desired, the laser beams have to be focused on the material for forming the glass-forming sealant, and the energy of the laser beams has to be increased during the sintering process.

Next, as shown in FIG. 3 and FIG. 4, in the OLED display devices of the aforementioned embodiments, the second substrate 12' comprises a metal line region 123 and a non-metal line region 124, and the metal line region 123 is adjacent to the non-metal line region 124. Hereinafter, the detail structures of the metal line region 123 and the non-metal line region 124 are illustrated below.

Figure 9:
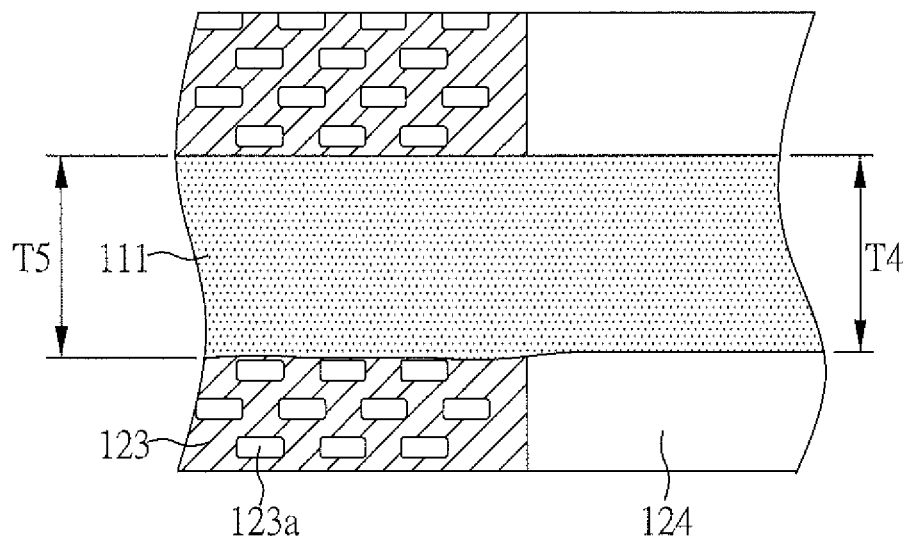
FIG. 9 is a top view showing a glass-forming sealant on a metal line region and a non-metal line region in an OLED display device according to one preferred embodiment of the present invention.

Please refer to FIG. 9, which is a top view showing a glass-forming sealant on a metal line region and a non-metal line region in the OLED display device of the present embodiment. As shown in FIG. 9, the metal line region 123 comprises: plural metal traces (not shown in the figure), a metal layer with plural holes 123a, or a combination thereof. Herein, only the metal line region 123 comprising the metal layer with plural holes 123a is presented in the figure. In addition, a width T5 of a section of the glass-forming sealant 111 corresponding to the metal line region 123 is larger than a width T4 thereof corresponding to the non-metal line region 124. The glass-forming sealant 111 cannot adhere on the metal formed on the metal line region 123 as well as on the substrate (not shown in the figure), and the contact area between the glass-forming sealant 111 and the substrate is reduced in this region. Hence, in the present embodiment, the width T5 of a section of the glass-forming sealant 111 corresponding to the metal line region 123 is designed to be larger than the width T4 thereof corresponding to the non-metal line region 124, and therefore the contact area between the glass-forming sealant 111 and the substrate can be increased to improve the problem that the glass-forming sealant 111 may peel off from the substrate in the metal line region 123.

Figure 10:
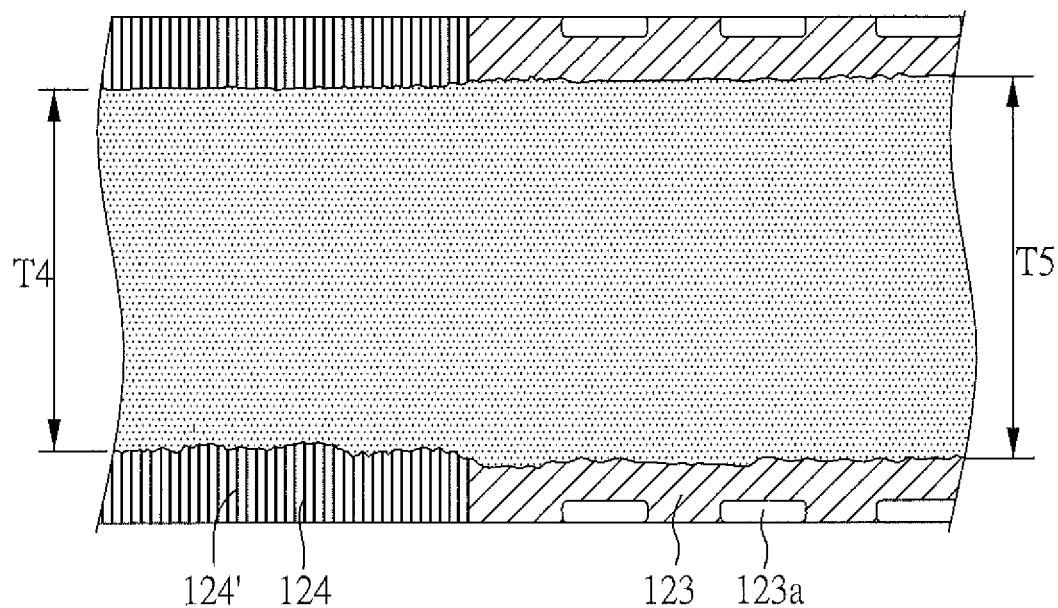
FIG. 10 is a top view showing a glass-forming sealant on a metal line region and a non-metal line region in an OLED display device according to another preferred embodiment of the present invention.

In addition, please refer to FIG. 10, which is a top view showing a glass-forming sealant on a metal line region and a non-metal line region in an OLED display device in another embodiment of the present invention. The OLED display device of the present embodiment not only has the aforementioned features shown in FIG. 9, but also comprises a dummy pattern 124' in the non-display region of the non-metal line region 124. The heat is transferred faster in the metal line region 123 than in the non-metal line region 124, so heat transmission rates in these two regions are differed during the laser sintering process. Hence, the dummy pattern 124' used in the OLED display device of the present embodiment can solve the problem of the heat transmission rate differed in these two regions. Furthermore, it is shown that the glass-forming sealant has a rough edge in the OLED display device of the present embodiment, as shown in FIG. 10.

Figure 11:
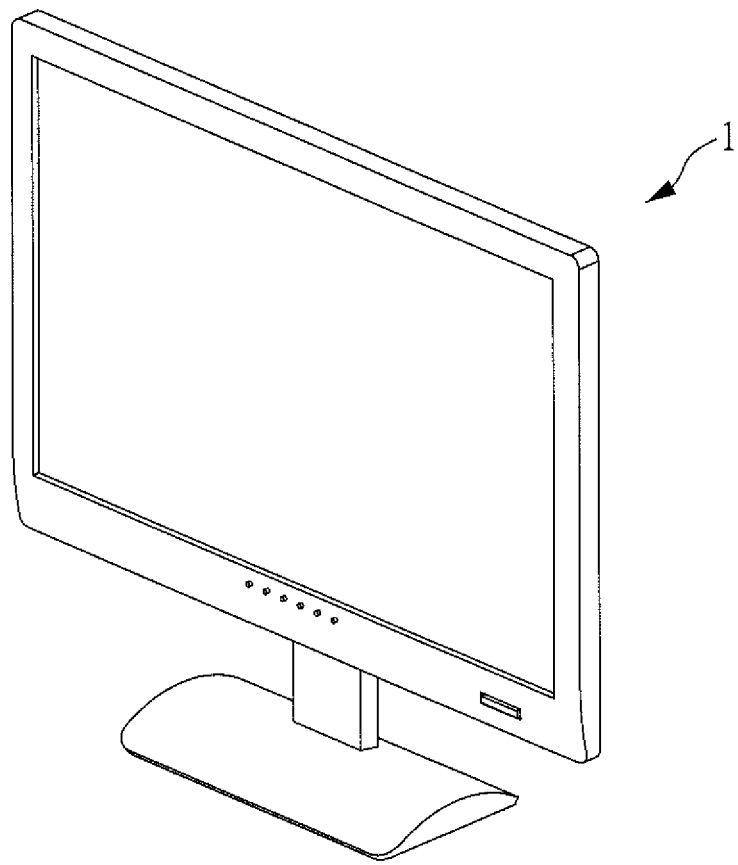
FIG. 11 is a perspective view of an OLED display device according to one preferred embodiment of the present invention.

FIG. 11 is a perspective view of an OLED display device according to one preferred embodiment of the present invention, which is a monitor 1. Herein, only the monitor is used as an application example of the OLED display device of the present invention, and the OLED display device provided by the present invention can be applied to other electronic products such as mobile phones, notebooks, cameras, video cameras, music players, navigation systems, and televisions.

Although the present invention has been explained in relation to its preferred embodiment, it is to be understood that many other possible modifications and variations can be made without departing from the spirit and scope of the invention as hereinafter claimed.

What is claimed is:

1. An OLED display device, comprising:
   a first substrate having a first surface, wherein the first surface has a first side;
   an organic light emitting layer disposed on the first substrate; and
   a glass-forming sealant disposed on the first substrate and being adjacent to the first side, wherein the glass-forming sealant has a top surface, a bottom surface and a middle surface, the middle surface is between the top surface and the bottom surface, and the top surface is opposite to the bottom surface; wherein the middle surface has a first end, a second end and a third end, the first end connects to the top surface, the second end connects to the bottom surface, and the third end locates between the first end and the second end;
   wherein a first projection of the first end projected on the first surface is apart from the first side in a first distance, a second projection of the second end projected on the first surface is apart from the first side in a second distance, a third projection of the third end projected on the first surface is apart from the first side in a third distance; and
   wherein the first distance is unequal to the second distance, and the third distance is shorter than the first distance or the second distance.

2. The OLED display device as claimed in claim 1, wherein the third distance is shorter than the first distance and the second distance.

3. The OLED display device as claimed in claim 1, wherein the first substrate comprises a first region and a second region adjacent to the first region, plural metal traces, a metal layer with plural holes, or a combination thereof are disposed in the first region, and a width of a section of the glass-forming sealant corresponding to the first region is larger than that corresponding to the second region.

4. The OLED display device as claimed in claim 3, wherein the second region comprises: a dummy pattern.

5. The OLED display device as claimed in claim 1, wherein the glass-forming sealant comprises: an upper-end-portion surface of a first portion adjacent to the top surface, in which a first angle is formed between a first tangent line along the upper-end-portion surface and an extension surface of the top surface, which is smaller than 90°; and a lower-end-portion surface of a second portion adjacent to the first surface of the first substrate, in which a second angle is formed between a second tangent line along the lower-end-portion surface and the first surface, which is smaller than 90°, and the first angle is different from the second angle.

6. The OLED display device as claimed in claim 5, wherein the first angle is smaller than the second angle.

7. The OLED display device as claimed in claim 5, wherein the glass-forming sealant further comprises a third portion locating between the first portion and the second portion, and the third portion comprises a region that the glass-forming sealant has a maximum width of a section thereof.

8. The OLED display device as claimed in claim 7, wherein the first portion has a first width, the second portion has a second width, and the first width is larger than the second width.

9. An OLED display device, comprising:
a first substrate comprising a first region and a second region adjacent to the first region;
an organic light emitting layer disposed on the first substrate; and
a glass-forming sealant disposed on the first substrate and around the organic light emitting layer,
wherein plural metal traces, a metal layer with plural holes, or a combination thereof are disposed in the first region, and a width of a section of the glass-forming sealant corresponding to the first region is larger than that corresponding to the second region.

10. The OLED display device as claimed in claim 9, wherein the glass-forming sealant has a bottom surface facing to the first substrate and a top surface opposite to the bottom surface; the glass-forming sealant further comprises: an upper-end-portion surface of a first portion adjacent to the top surface, in which a first angle is formed between a first tangent line along the upper-end-portion surface and an extension surface of the top surface, which is smaller than 90°; and a lower-end-portion surface of a second portion adjacent to a first surface of the first substrate, in which a second angle is formed between a second tangent line along the lower-end-portion surface and the first surface, which is smaller than 90°, and the first angle is different from the second angle.

11. The OLED display device as claimed in claim 10, wherein the first angle is smaller than the second angle.

12. The OLED display device as claimed in claim 10, wherein the glass-forming sealant further comprises a third portion locating between the first portion and the second portion, and the third portion comprises a region that the glass-forming sealant has a maximum width of a section thereof.

13. The OLED display device as claimed in claim 12, wherein the first portion has a first width, the second portion has a second width, and the first width is larger than the second width.

14. An OLED display device, comprising
a first substrate having a first surface, wherein the first surface has a first side;
an organic light emitting layer disposed on the first substrate; and
a sealant disposed on the first substrate and being adjacent to the first side, wherein the sealant has a top surface, a bottom surface and a middle surface, the middle surface is between the top surface and the bottom surface, and the top surface is opposite to the bottom surface; wherein the middle surface has a first end, a second end and a third end, the first end connects to the top surface, the second end connects to the bottom surface, the third end locates between the first end and the second end, and at least one of the first end and the second end is relatively close to the first side compared to the third end;
wherein a first projection of the first end projected on the first surface is apart from the first side in a first distance, a second projection of the second end projected on the first surface is apart from the first side in a second distance, a third projection of the third end projected on the first surface is apart from the first side in a third distance; and
wherein the first distance is unequal to the second distance, and the third distance is shorter than the first distance or the second distance.

15. The OLED display device as claimed in claim 14, wherein the sealant comprises a first extension part adjacent to the first substrate, and a protrusion part adjacent to the first extension part, wherein the second end locates on the first extension part, the first end, the third end and a fourth end located on the protrusion part, the third end locates between the first end and the fourth end in a horizontal direction of the first surface, the fourth end connects to the first extension part, a fourth projection of the fourth end projected on the first surface is apart from the first side in a fourth distance, the second distance is shorter than the third distance, and the third distance is shorter than the fourth distance.

16. The OLED display device as claimed in claim 14, wherein the sealant comprises a second extension part and a protrusion part, and the protrusion part locates between the second extension part and the first substrate; wherein the first end locates on the second extension part, the second end, the third end and a fifth end locates on the protrusion part, the third end locates between the second end and the fifth end in a horizontal direction of the first surface, the fifth end connects to the second extension part, a fifth projection of the fifth end projected on the first surface is apart from the first side in a fifth distance, the first distance is shorter than the third distance, and the third distance is shorter than the fifth distance.

* * * * *